(12) United States Patent
Nomura et al.

(10) Patent No.: US 11,650,336 B2
(45) Date of Patent: May 16, 2023

(54) RADIATION DETECTOR

(71) Applicant: KABUSHIKI KAISHA TOSHIBA, Tokyo (JP)

(72) Inventors: Yuko Nomura, Kawasaki (JP); Kohei Nakayama, Kawasaki (JP); Atsushi Wada, Kawasaki (JP); Fumihiko Aiga, Kawasaki (JP); Isao Takasu, Setagaya (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/445,848

(22) Filed: Aug. 25, 2021

(65) Prior Publication Data

US 2022/0283323 A1 Sep. 8, 2022

(30) Foreign Application Priority Data

Mar. 5, 2021 (JP) .............................. JP2021-035026

(51) Int. Cl.
*G01T 1/20* (2006.01)
*G01T 1/24* (2006.01)
*G01T 3/06* (2006.01)
*G01T 3/08* (2006.01)

(52) U.S. Cl.
CPC .............. *G01T 1/2006* (2013.01); *G01T 1/24* (2013.01); *G01T 3/06* (2013.01); *G01T 3/08* (2013.01); *H10K 30/451* (2023.02); *H10K 30/80* (2023.02)

(58) Field of Classification Search
CPC ............ G01T 1/2006; G01T 1/24; G01T 3/06
See application file for complete search history.

(56) References Cited

U.S. PATENT DOCUMENTS

| 2004/0113085 | A1* | 6/2004 | Heismann ............. G01T 1/2018 250/370.11 |
| 2011/0017919 | A1* | 1/2011 | Mochizuki ........ H01L 27/14623 257/292 |
| 2018/0143329 | A1 | 5/2018 | Takasu et al. |
| 2019/0285759 | A1 | 9/2019 | Nakayama et al. |
| 2021/0055435 | A1 | 2/2021 | Aiga et al. |

FOREIGN PATENT DOCUMENTS

| JP | 2018-085387 A | 5/2018 |
| JP | 2019-161043 A | 9/2019 |
| JP | 2021-034447 A | 3/2021 |

\* cited by examiner

*Primary Examiner* — Hugh Maupin
(74) *Attorney, Agent, or Firm* — Oblon, McClelland, Maier & Neustadt, L.L.P.

(57) ABSTRACT

According to one embodiment, a radiation detector includes a first member including a scintillator layer, an organic member including an organic semiconductor layer, and a first conductive layer. The first conductive layer includes a first conductive region and a second conductive region. A second direction from the first conductive region toward the second conductive region crosses a first direction from the organic member toward the first member. A first portion of the organic member is between the first conductive region and the second conductive region in the second direction.

21 Claims, 3 Drawing Sheets

RADIATION DETECTOR

CROSS-REFERENCE TO RELATED APPLICATIONS

This application is based upon and claims the benefit of priority from Japanese Patent Application No. 2021-035026, filed on Mar. 5, 2021; the entire contents of which are incorporated herein by reference.

FIELD

Embodiments described herein relate generally to a radiation detector.

BACKGROUND

It is desirable to increase the detection efficiency of a radiation detector.

DETAILED DESCRIPTION

Figure 1A:
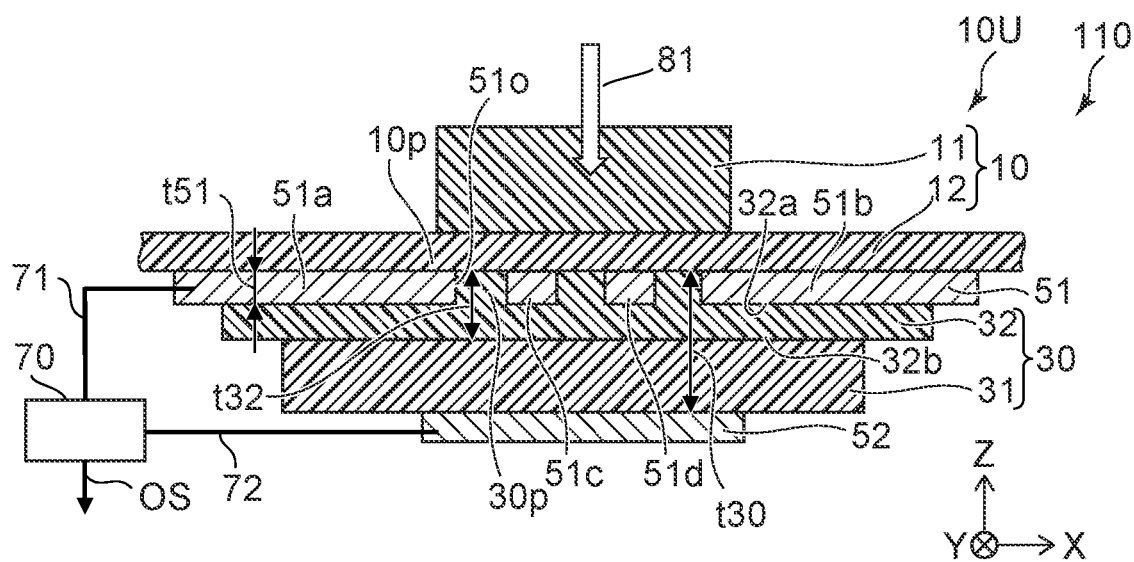
FIGS. 1A and 1B are schematic views illustrating a radiation detector according to a first embodiment.

According to one embodiment, a radiation detector includes a first member including a scintillator layer, an organic member including an organic semiconductor layer, and a first conductive layer. The first conductive layer includes a first conductive region and a second conductive region. A second direction from the first conductive region toward the second conductive region crosses a first direction from the organic member toward the first member. A first portion of the organic member is between the first conductive region and the second conductive region in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
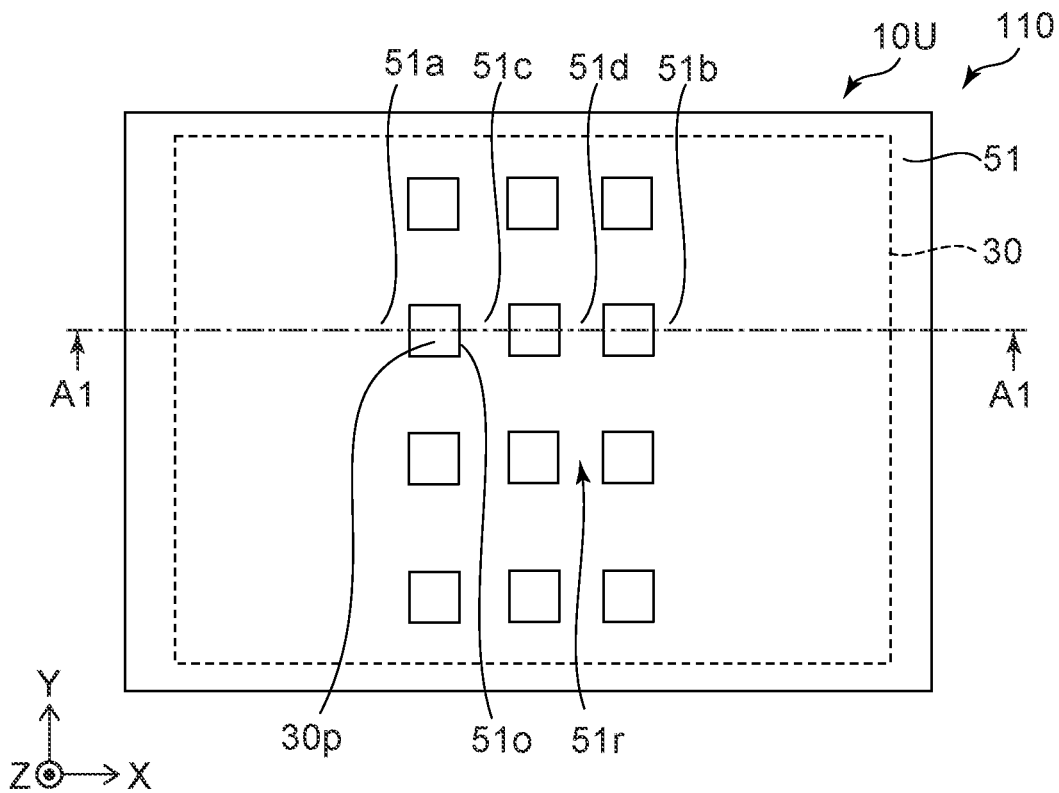

FIGS. 1A and 1B are schematic views illustrating a radiation detector according to a first embodiment.

FIG. 1A is a line A1-A1 cross-sectional view of FIG. 1B. FIG. 1B is a plan view in which a portion included in the radiation detector is extracted.

As shown in FIG. 1A, the radiation detector 110 according to the embodiment includes a first member 10, an organic member 30, and a first conductive layer 51. The first member 10 includes a scintillator layer 11. The organic member 30 includes an organic semiconductor layer 31. At least a portion of the first conductive layer 51 is located between the organic member 30 and the first member 10. The first member 10, the organic member 30, and the first conductive layer 51 may be included in one detecting part 10U.

The direction from the organic member 30 toward the first member 10 is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction. For example, the first direction (the Z-axis direction) corresponds to the stacking direction.

As shown in FIG. 1A, the radiation detector 110 may further include a second conductive layer 52. The first conductive layer 51 is between the second conductive layer 52 and the first member 10 in the first direction (the Z-axis direction). The organic member 30 is between the second conductive layer 52 and the first conductive layer 51 in the first direction.

For example, radiation 81 of a detection object is incident on the scintillator layer 11 of the first member 10. The radiation 81 is converted into light in the scintillator layer 11. The light that is generated is incident on the organic semiconductor layer 31. A movable charge is generated in the organic semiconductor layer 31 based on the incident light. A bias voltage is applied between the first conductive layer 51 and the second conductive layer 52 by a detection circuit 70. Thereby, the generated charge moves toward the first conductive layer 51 or the second conductive layer 52. The charge that has moved is detected by the detection circuit 70. The radiation 81 of the detection object can be detected thereby. For example, the organic semiconductor layer 31 functions as a photoelectric conversion layer. The detection circuit 70 is electrically connected with the conductive layers by first wiring 71, second wiring 72, etc.

According to the embodiment, the first conductive layer 51 includes multiple regions 51r (referring to FIG. 1B). The first conductive layer 51 includes, for example, a first conductive region 51a and a second conductive region 51b. The first conductive layer 51 may further include, for example, a third conductive region 51c, a fourth conductive region 51d, etc. For example, the multiple regions 51r are arranged along a plane (e.g., the X-Y plane) that crosses the first direction (the Z-axis direction).

For example, a second direction from the first conductive region 51a toward the second conductive region 51b crosses the first direction (the Z-axis direction) from the organic member 30 toward the first member 10. The second direction is along the X-Y plane. The second direction may be, for example, the X-axis direction.

A first portion 30p of the organic member 30 is between the first conductive region 51a and the second conductive region 51b in the second direction (e.g., the X-axis direction). For example, a portion of the light generated in the scintillator layer 11 can be incident on the organic semiconductor layer 31 without passing through the first conductive layer 51. For example, loss of the light that is caused by absorption of the light by the first conductive layer 51 can be suppressed.

The first conductive layer 51 may be light-transmissive. A reference example may be considered in which the light-transmissive first conductive layer 51 is inserted into all regions between the organic member 30 and the scintillator layer 11 in the detecting part 10U. In the reference example, the light that is generated in the scintillator layer 11 is incident on the organic semiconductor layer 31 by passing through the light-transmissive first conductive layer 51. In the reference example, for example, loss occurs due to reflections due to the refractive index difference between the first conductive layer 51 and the first member 10. Therefore, in the reference example, it is difficult to obtain a sufficiently high efficiency.

Conversely, according to the embodiment, the first portion 30p of the organic member 30 is between the first conductive region 51a and the second conductive region 51b. A portion of the light that is generated in the scintillator layer 11 can be incident on the organic semiconductor layer 31 without passing through the first conductive layer 51. The loss that is caused by reflections at the interface can be suppressed. According to the embodiment, a radiation detector can be provided in which the detection efficiency can be increased.

According to the embodiment, the light that is emitted from the scintillator layer 11 is, for example, visible light. For example, the peak wavelength of the light is not less than 450 nm and not more than 680 nm. In one example, the peak wavelength is not less than 480 nm and not more than 580 nm. A refractive index difference for such light exists. In such a case as well, the loss of the light can be suppressed by providing the first portion 30p of the organic member 30 between the first conductive region 51a and the second conductive region 51b.

As described above, the scintillator layer 11 emits light when the radiation 81 is incident on the scintillator layer 11. The peak wavelength of the light is taken as a first peak wavelength. The first member 10 includes a first opposing portion 10p that faces the first conductive region 51a. The refractive index of the first opposing portion 10p for the first peak wavelength is taken as a first refractive index. The refractive index of the first portion 30p for the first peak wavelength is taken as a second refractive index. The refractive index of the first conductive layer 51 for the first peak wavelength is taken as a third refractive index.

According to the embodiment, for example, the absolute value of the difference between the first refractive index and the second refractive index is less than the absolute value of the difference between the first refractive index and the third refractive index. By setting the absolute value of the difference between the first refractive index and the second refractive index to be small, the loss due to the reflections can be effectively suppressed.

For example, the first opposing portion 10p of the first member 10 includes an organic material. The first portion 30p includes an organic material. The refractive index difference of these materials is small. For example, the first conductive layer 51 includes an inorganic material. The refractive index of the first conductive layer 51 is much different from the refractive index of an organic material.

In one example, the first refractive index is not less than 1.43 but less than 1.65. The second refractive index is not less than 1.43 but less than 1.65. The third refractive index is not less than 1.65 and not more than 2.8.

In another example, the first refractive index is not less than 1.43 but less than 1.69. The second refractive index is not less than 1.43 but less than 1.69. The third refractive index is not less than 1.69 and not more than 2.8.

For example, the first conductive layer 51 includes In, Sn, and oxygen. In one example, the first conductive layer 51 includes, for example, ITO (Indium Tin Oxide). The loss that is caused by reflections by the first portion 30p of the organic member 30 that is between the first conductive region 51a and the second conductive region 51b is suppressed.

The first conductive layer 51 may include a metal film. The metal film includes, for example, at least one selected from the group consisting of aluminum, silver, and nickel. The loss that is caused by the metal film can be suppressed because the first portion 30p of the organic member 30 is between the first conductive region 51a and the second conductive region 51b. For example, the loss is caused by at least one of reflecting or absorbing.

For example, the scintillator layer 11 includes an organic material. Thereby, for example, beta rays can be detected with high accuracy while suppressing the effects of other radiation.

According to the embodiment, the first portion 30p contacts the first member 10.

In the example as shown in FIG. 1A, the first member 10 includes a base body 12. At least a portion of the base body 12 is between the organic member 30 and the scintillator layer 11 in the first direction (the Z-axis direction). A portion of the base body 12 is between the first portion 30p and the scintillator layer 11 in the first direction. The base body 12 includes, for example, an organic material. For example, at least a portion of the base body 12 may correspond to the first opposing portion 10p described above. The base body 12 may be, for example, a resin substrate. The first conductive layer 51 may be located at one surface of the base body 12. The scintillator layer 11 may be located at another surface of the base body 12.

The refractive index of the base body 12 for the first peak wavelength is, for example, not less than 1.43 but less than 1.65.

In the example as shown in FIG. 1A, the organic member 30 includes an organic conductive layer 32. At least a portion of the organic conductive layer 32 is between the organic semiconductor layer 31 and the first conductive layer 51 in the first direction (the Z-axis direction). The organic conductive layer 32 may include the first portion 30p described above. For example, at least a portion of the organic conductive layer 32 may be between the first conductive region 51a and the second conductive region 51b in the second direction.

The refractive index of the organic conductive layer 32 for the first peak wavelength is, for example, not less than 1.43 but less than 1.65. The organic conductive layer 32 may be, for example, a hole transport layer.

For example, the organic conductive layer 32 may have planarizing function. For example, the organic conductive layer 32 includes a first surface 32a and a second surface 32b. The first surface 32a is between the second surface 32b and the first conductive layer 51 in the first direction (the Z-axis direction). The second surface 32b is flatter than the first surface 32a. For example, planarization is performed by forming the organic conductive layer 32 that includes the organic material on the surface of the first conductive layer 51.

For example, a thickness t32 of the organic conductive layer 32 is greater than a thickness t51 of the first conductive layer 51. For example, a thickness t30 of the organic member 30 is greater than the thickness t51 of the first conductive layer 51. The thickness t51 is, for example, not less than 50 nm and not more than 150 nm. The thickness t32 is, for example, not less than 60 nm and not more than 190 nm. The thickness t30 is, for example, not less than 140 nm and not more than 1200 nm.

As shown in FIG. 1A, a portion of the organic member 30 may be located between the multiple regions 51r in the second direction (e.g., the X-axis direction, the Y-axis direction, etc.). A portion of the organic member 30 may be located between the first conductive region 51a and the third conductive region 51c in the second direction (e.g., the X-axis direction, the Y-axis direction, etc.). A portion of the organic member 30 may be located between the third conductive region 51c and the fourth conductive region 51d in the second direction (e.g., the X-axis direction, the Y-axis direction, etc.). A portion of the organic member 30 may be located between the fourth conductive region 51d and the second conductive region 51b in the second direction (e.g., the X-axis direction, the Y-axis direction, etc.).

For example, the first conductive layer 51 may include an opening 51o. The opening 51O is between the first conductive region 51a and the second conductive region 51b. The first portion 30p may be filled into the opening 51o.

According to the embodiment, it is favorable for the opening ratio of the first conductive layer 51 to be not more than 75%. The loss of the light can be effectively suppressed thereby. The opening ratio may be not less than 25%. Thereby, an electric field can be effectively applied to the organic semiconductor layer 31. The first conductive layer 51 includes a region that overlaps the second conductive layer 52. The opening ratio of the first conductive layer 51 is, for example, an opening ratio of the first conductive layer 51 in the region that overlaps the second conductive layer 52 of the first conductive layer 51.

The detecting part 10U may include the second conductive layer 52 in addition to the first member 10, the organic member 30, and the first conductive layer 51.

Figure 2A:
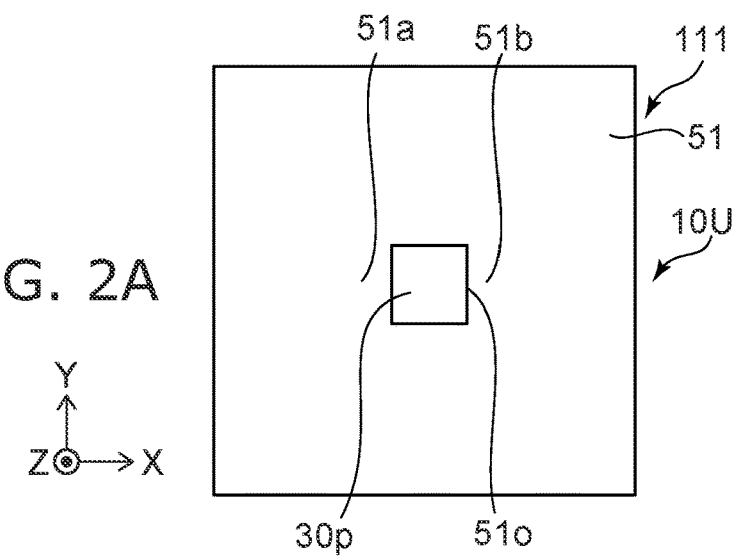
FIGS. 2A to 2C are schematic plan views illustrating portions of radiation detectors according to the first embodiment.
Figure 2B:
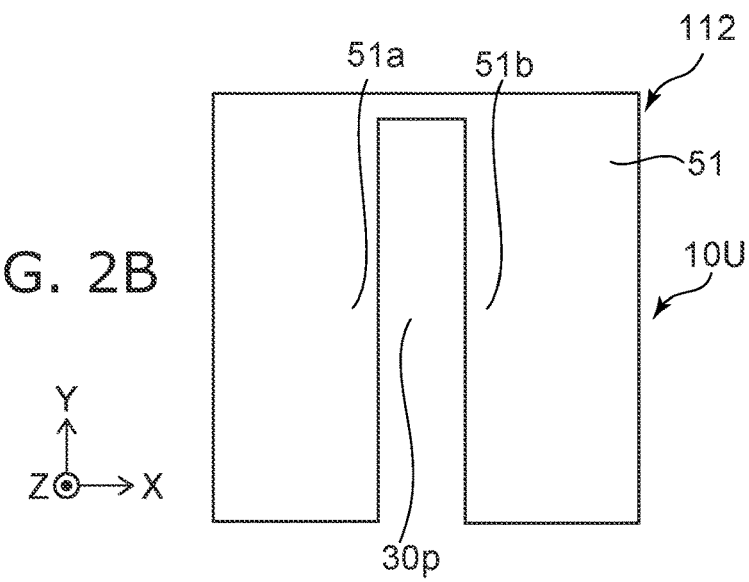
Figure 2C:
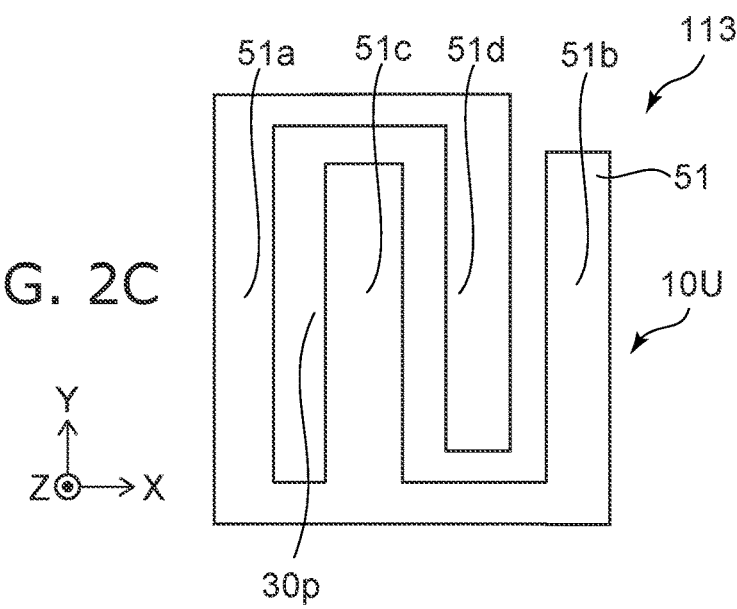

FIGS. 2A to 2C are schematic plan views illustrating portions of radiation detectors according to the first embodiment.

These drawings illustrate planar patterns of the first conductive layer 51.

In a radiation detector 111 according to the embodiment as shown in FIG. 2A, the number of the openings 51O is 1. The opening 51O is located between the first conductive region 51a and the second conductive region 51b.

In a radiation detector 112 according to the embodiment as shown in FIG. 2B, the region between the first conductive region 51a and the second conductive region 51b is exposed to the outside.

In a radiation detector 113 according to the embodiment as shown in FIG. 2C, the first conductive region 51a and the second conductive region 51b have a meandering shape (or a comb teeth configuration).

In the radiation detectors 111 to 113 as well, the loss of the light can be suppressed. A radiation detector can be provided in which the detection efficiency can be increased.

According to the embodiment, the organic semiconductor layer 31 includes, for example, a p-type region and an n-type region. The p-type region includes, for example, at least one of polythiophene or a polythiophene derivative. The n-type region includes, for example, a fullerene derivative. In one example, the organic semiconductor layer 31 includes, for example, poly(3-hexylthiophene) and [6,6]-phenyl-$C_{61}$-butyric acid methyl ester. The p-type region may include, for example, chloro boron subphthalocyanine (SubPc). The n-type region may include, for example, pentafluorophenoxy boron subphthalocyanine (F5-SubPc).

The organic conductive layer 32 may include, for example, NPD (N,N"-di(1-naphthyl)-N,N"-diphenylbenzidine), etc. The organic conductive layer 32 may include, for example, a triarylamine material.

The scintillator layer 11 includes, for example, a metal complex. The metal complex includes, for example, at least one selected from the group consisting of Ir, Pt, and Cu. The scintillator layer 11 includes, for example, a thermally activated delayed fluorescence (TADF) material. The scintillator layer 11 includes, for example, plastic scintillator.

The base body 12 includes, for example, a resin. The resin includes, for example, at least one selected from the group consisting of PET, PEN, transparent polyimide, cycloolefin polymer (COP), and polycarbonate.

The second conductive layer 52 includes, for example, a metal. The metal includes, for example, at least one selected from the group consisting of aluminum, silver, and nickel.

According to the embodiment, the sensitivity of the radiation detector may be high for beta rays and low for other radiation. For example, the sensitivity of the first signal generated between the first conductive layer 51 and the second conductive layer 52 when beta rays are incident on the first member 10 is greater than the sensitivity of the second signal generated between the first conductive layer 51 and the second conductive layer 52 when at least one of gamma rays, neutron rays, or X-rays are incident on the first member 10. High selectivity is obtained for the detection of beta rays by combining the organic semiconductor layer 31 with the organic scintillator layer 11.

An example of optical simulation results relating to the radiation detector will now be described. In a first model, the first conductive layer 51 does not include multiple regions. In the first model, the organic member 30 and the first member 10 are separated by the first conductive layer 51. In a second model, the opening 51O is provided in the first conductive layer 51. A portion of the organic member 30 is filled into the opening 51o. The opening ratio of the second model is 25%.

In the first model, the light that is incident on the organic semiconductor layer 31 is 73.4% of the light emitted by the scintillator layer 11. In the second model, the light that is incident on the organic semiconductor layer 31 is 75.8% of the light emitted by the scintillator layer 11. The loss of the light can be suppressed by providing a portion of the organic member 30 in the opening 51o.

Second Embodiment

Figure 3:
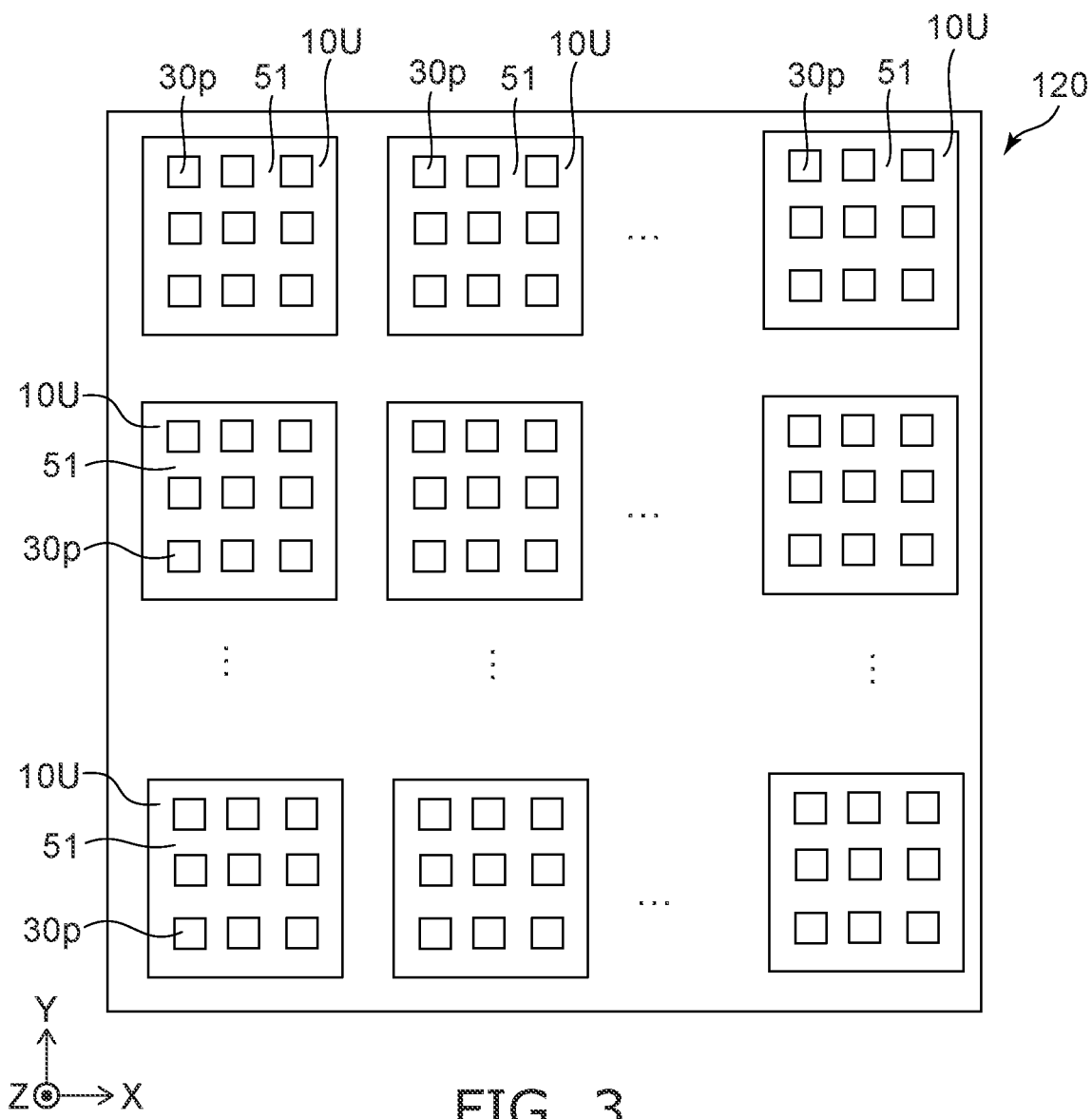
FIG. 3 is a schematic plan view illustrating a radiation detector according to a second embodiment.

FIG. 3 is a schematic plan view illustrating a radiation detector according to a second embodiment.

As shown in FIG. 3, the radiation detector 120 according to the embodiment includes multiple detecting parts 10U. The multiple detecting parts 10U are arranged along directions crossing the first direction (the Z-axis direction). For example, the multiple detecting parts 10U are two-dimensionally arranged along the X-Y plane.

Embodiments may include, for example, the following configurations (e.g., technological proposals).

Configuration 1

A radiation detector, comprising:
a first member including a scintillator layer;
an organic member including an organic semiconductor layer; and
a first conductive layer,
the first conductive layer including a first conductive region and a second conductive region,
a second direction from the first conductive region toward the second conductive region crossing a first direction from the organic member toward the first member,
a first portion of the organic member being between the first conductive region and the second conductive region in the second direction.

Configuration 2

The radiation detector according to Configuration 1, wherein the scintillator layer emits light when radiation is incident on the scintillator layer, the first member includes a first opposing portion facing the first conductive region, an absolute value of a difference between a first refractive index of the first opposing portion for a peak wavelength of the light and a second refractive index of the first portion for the peak wavelength is less than an absolute value of a difference between the first refractive index and a third refractive index of the first conductive layer for the peak wavelength.

Configuration 3

The radiation detector according to Configuration 2, wherein the first refractive index is not less than 1.43 but less than 1.69, the second refractive index is not less than 1.43 but less than 1.69, and the third refractive index is not less than 1.69 and not more than 2.8.

Configuration 4

The radiation detector according to any one of Configurations 1 to 3, wherein the first conductive layer includes In, Sn, and oxygen.

Configuration 5

The radiation detector according to Configuration 1, wherein the first conductive layer includes a metal film.

Configuration 6

The radiation detector according to any one of Configurations 1 to 5, wherein the first portion contacts the first member.

Configuration 7

The radiation detector according to any one of Configurations 1 to 6, wherein the scintillator layer includes an organic material.

Configuration 8

The radiation detector according to any one of Configurations 1 to 7, wherein the first member includes a base body, and at least a portion of the base body is between the organic member and the scintillator layer in the first direction.

Configuration 9

The radiation detector according to Configuration 8, wherein a portion of the base body is between the first portion and the scintillator layer in the first direction.

Configuration 10

The radiation detector according to Configuration 8 or 9, wherein the base body includes an organic material.

Configuration 11

The radiation detector according to any one of Configurations 1 to 10, wherein the organic member includes an organic conductive layer, and at least a portion of the organic conductive layer is between the organic semiconductor layer and the first conductive layer.

Configuration 12

The radiation detector according to Configuration 11, wherein the organic conductive layer includes the first portion.

Configuration 13

The radiation detector according to Configuration 11 or Configuration 12, wherein the organic conductive layer includes a first surface and a second surface, the first surface is between the second surface and the first conductive layer in the first direction, and the second surface is flatter than the first surface.

Configuration 14

The radiation detector according to any one of Configurations 11 to 13, wherein a thickness of the organic conductive layer is greater than a thickness of the first conductive layer.

Configuration 15

The radiation detector according to any one of Configurations 1 to 14, wherein a thickness of the organic member is greater than a thickness of the first conductive layer.

Configuration 16

The radiation detector according to any one of Configurations 1 to 15, wherein the first conductive layer includes an opening, the opening is between the first conductive region and the second conductive region, and the first portion is filled into the opening.

Configuration 17

The radiation detector according to any one of Configurations 1 to 16, wherein an opening ratio of the first conductive layer is not more than 75%.

Configuration 18

The radiation detector according to any one of Configurations 1 to 17, further comprising:

a second conductive layer, the first conductive layer being between the second conductive layer and the first member in the first direction, an organic member being between the second conductive layer and the first conductive layer in the first direction.

Configuration 19

The radiation detector according to Configuration 18, wherein a sensitivity of a first signal generated between the first conductive layer and the second conductive layer when beta rays are incident on the first member is greater than a sensitivity of a second signal generated between the first conductive layer and the second conductive layer when at least one of gamma rays, neutron rays, or X-rays are incident on the first member.

Configuration 20

The radiation detector according to any one of Configurations 1 to 19, wherein the organic semiconductor layer includes polythiophene and a fullerene derivative.

According to embodiments, a radiation detector can be provided in which the detection efficiency can be increased.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as members, scintillator layers, organic members, conductive layers, organic semiconductor layers, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a first member including a scintillator layer;
an organic member including an organic semiconductor layer; and
a first conductive layer,
the first conductive layer including a first conductive region and a second conductive region,
a plane extending along a second direction from the first conductive region toward the second conductive region intersects a plane extending along a first direction from the organic member toward the first member,
a first portion of the organic member being between the first conductive region and the second conductive region in the second direction,
wherein the first member includes a base body, and
wherein at least a portion of the base body is between the organic member and the scintillator layer in the first direction.

2. The detector according to claim 1, wherein
the scintillator layer emits light when radiation is incident on the scintillator layer,
the first member includes a first opposing portion facing the first conductive region,
an absolute value of a difference between a first refractive index of the first opposing portion for a peak wavelength of the light and a second refractive index of the first portion for the peak wavelength is less than an absolute value of a difference between the first refractive index and a third refractive index of the first conductive layer for the peak wavelength.

3. The detector according to claim 2, wherein
the first refractive index is not less than 1.43 but less than 1.69,
the second refractive index is not less than 1.43 but less than 1.69, and
the third refractive index is not less than 1.69 and not more than 2.8.

4. The detector according to claim 1, wherein the first conductive layer includes In, Sn, and oxygen.

5. The detector according to claim 1, wherein the first conductive layer includes a metal film.

6. The detector according to claim 1, wherein the first portion contacts the first member.

7. The detector according to claim 1, wherein the scintillator layer includes an organic material.

8. The detector according to claim 1, wherein a portion of the base body is between the first portion and the scintillator layer in the first direction.

9. The detector according to claim 1, wherein the base body includes an organic material.

10. The detector according to claim 1, wherein
the organic member includes an organic conductive layer, and
at least a portion of the organic conductive layer is between the organic semiconductor layer and the first conductive layer.

11. The detector according to claim 10, wherein the organic conductive layer includes the first portion.

12. The detector according to claim 10, wherein
the organic conductive layer includes a first surface and a second surface,
the first surface is between the second surface and the first conductive layer in the first direction, and
the second surface is flatter than the first surface.

13. The detector according to claim 10, wherein a thickness of the organic conductive layer is greater than a thickness of the first conductive layer.

14. The detector according to claim 1, wherein a thickness of the organic member is greater than a thickness of the first conductive layer.

15. The detector according to claim 1, wherein
the first conductive layer includes an opening,
the opening is between the first conductive region and the second conductive region, and
the first portion is filled into the opening.

16. The detector according to claim 1, wherein an opening ratio of the first conductive layer is not more than 75%.

17. The detector according to claim 1, further comprising:
a second conductive layer,
the first conductive layer being between the second conductive layer and the first member in the first direction,
an organic member being between the second conductive layer and the first conductive layer in the first direction.

18. The detector according to claim 17, wherein a sensitivity of a first signal generated between the first conductive layer and the second conductive layer when beta rays are incident on the first member is greater than a sensitivity of a second signal generated between the first conductive layer and the second conductive layer when at least one of gamma rays, neutron rays, or X-rays are incident on the first member.

19. The detector according to claim 1, wherein the organic semiconductor layer includes polythiophene and a fullerene derivative.

20. A radiation detector, comprising:
a first member including a scintillator layer;
an organic member including an organic semiconductor layer; and
a first conductive layer, the first conductive layer including a first conductive region and a second conductive region,
a plane extending along a second direction from the first conductive region toward the second conductive region intersects a plane extending along a first direction from the organic member toward the first member,
a first portion of the organic member being between the first conductive region and the second conductive region in the second direction,
wherein
the organic member includes an organic conductive layer, and
at least a portion of the organic conductive layer is between the organic semiconductor layer and the first conductive layer.

21. A radiation detector, comprising:
a first member including a scintillator layer;
an organic member including an organic semiconductor layer; and
a first conductive layer,
the first conductive layer including a first conductive region and a second conductive region,
a plane extending along a second direction from the first conductive region toward the second conductive region intersects a plane extending along a first direction from the organic member toward the first member,
a first portion of the organic member being between the first conductive region and the second conductive region in the second direction,
wherein an opening ratio of the first conductive layer is not more than 75%.

* * * * *